(12) United States Patent
Jeong

(10) Patent No.: US 11,684,956 B2
(45) Date of Patent: Jun. 27, 2023

(54) APPARATUS FOR TREATING SUBSTRATE

(71) Applicant: SEMES CO., LTD., Chungcheongnam-do (KR)

(72) Inventor: Cheol Hwan Jeong, Gyeonggi-do (KR)

(73) Assignee: SEMES CO., LTD., Chungcheongnam-do (KR)

(*) Notice: Subject to any disclaimer, the term of this patent is extended or adjusted under 35 U.S.C. 154(b) by 265 days.

(21) Appl. No.: 17/085,988

(22) Filed: Oct. 30, 2020

(65) Prior Publication Data

US 2021/0129193 A1 May 6, 2021

(30) Foreign Application Priority Data

Oct. 31, 2019 (KR) .................. 10-2019-0137951

(51) Int. Cl.
| | |
|---|---|
| *B08B 3/10* | (2006.01) |
| *B08B 5/02* | (2006.01) |
| *B08B 7/04* | (2006.01) |
| *H01L 21/67* | (2006.01) |
| *B08B 15/02* | (2006.01) |

(52) U.S. Cl.
CPC .................. *B08B 3/10* (2013.01); *B08B 5/02* (2013.01); *B08B 7/04* (2013.01); *H01L 21/6719* (2013.01); *H01L 21/67051* (2013.01); *B08B 15/02* (2013.01); *H01L 21/67017* (2013.01)

(58) Field of Classification Search
CPC .. B08B 15/02; B08B 7/04; B08B 5/02; B08B 3/10; H01L 21/67017; H01L 21/67051; H01L 21/6719
See application file for complete search history.

(56) References Cited

U.S. PATENT DOCUMENTS

| | | | |
|---|---|---|---|
| 10,103,018 B2* | 10/2018 | Kim | ................. H01L 21/02 |
| 11,414,759 B2* | 8/2022 | Lin | ................. C30B 25/14 |
| 2001/0013504 A1* | 8/2001 | Imafuku | ............. C23C 16/5096 |
| | | | 156/345.44 |
| 2007/0141951 A1* | 6/2007 | Naoki | ............... H01L 21/67051 |
| | | | 451/5 |

(Continued)

FOREIGN PATENT DOCUMENTS

| | | |
|---|---|---|
| JP | 201040818 A | 2/2010 |
| JP | 2014-067833 A | 4/2014 |

(Continued)

*Primary Examiner* — Benjamin L Osterhout
(74) *Attorney, Agent, or Firm* — Procopio, Cory, Hargreaves & Savitch LLP

(57) ABSTRACT

Embodiments of the inventive concept provides an apparatus for treating a substrate. The apparatus for treating a substrate comprises a housing having a process space therein, a substrate support unit supporting a substrate in the space, a liquid supply unit supplying a liquid to a substrate supported by the substrate support unit, an air flow generation unit generating an air flow in the process space, and the air flow generation unit comprises a first gas supply unit supplying a descending air flow of a first gas in the process space and a second gas supply unit supplying a second gas having lower humidity than the first gas in the space, and when viewed from above, the first gas supply unit and the second gas supply unit are not overlapped each other.

19 Claims, 7 Drawing Sheets

(56) References Cited

U.S. PATENT DOCUMENTS

| | | | |
|---|---|---|---|
| 2010/0062159 A1* | 3/2010 | Tanaka | C23C 18/31 427/310 |
| 2012/0187083 A1* | 7/2012 | Hashizume | B05C 11/00 216/37 |
| 2012/0234356 A1* | 9/2012 | Nishi | H01L 21/02052 134/21 |
| 2017/0043379 A1* | 2/2017 | Sasaki | B08B 3/12 |
| 2018/0164689 A1* | 6/2018 | Sano | H01L 21/6719 |
| 2019/0067047 A1* | 2/2019 | Tanizawa | H01L 21/67051 |
| 2019/0091736 A1* | 3/2019 | Okutani | H01L 21/67109 |
| 2021/0241997 A1* | 8/2021 | Lee | H01J 37/32449 |
| 2021/0305014 A1* | 9/2021 | Kim | H01L 21/67109 |
| 2022/0059324 A1* | 2/2022 | Lee | H01J 37/32715 |

FOREIGN PATENT DOCUMENTS

| | | | |
|---|---|---|---|
| JP | 2018195686 A | 12/2018 | |
| KR | 10-2008-0035718 A | 4/2008 | |
| KR | 10-2014-0132601 A | 11/2014 | |
| KR | 10-2017-0137247 A | 12/2017 | |
| KR | 10-2019-0054348 A | 5/2019 | |
| KR | 10-1961947 B1 | 7/2019 | |

* cited by examiner

APPARATUS FOR TREATING SUBSTRATE

CROSS-REFERENCE TO RELATED APPLICATIONS

A claim for priority under 35 U.S.C. § 119 is made to Korean Patent Application No. 10-2019-0137951 filed on Oct. 31, 2019, in the Korean Intellectual Property Office, the entire contents of which are hereby incorporated by reference.

BACKGROUND

Embodiments of the inventive concept described herein relates to an apparatus for treating a substrate.

To manufacture a semiconductor device or a liquid crystal display, various processes such as a photolithography, an etching, an ashing, an ion implantation, and a thin-film deposition are performed on a substrate. Before or after processes are performed, a cleaning process is performed cleaning the substrate for removing contaminants and particles generated from each process.

In general, the cleaning process comprises a process liquid-treating a substrate. A liquid used in the cleaning process comprises acid or base chemicals. Thus, a mist is generated during or after the supplication of liquid to the substrate, and the mist contaminates a peripheral device and functions as a particle in treating the substrate. Therefore, in the cleaning process, a generation of mist is suppressed by forming a descending air flow.

In addition, the chemical used in the cleaning process is sensitive to temperature and humidity, thus a reactivity with the substrate changes. Accordingly, a substrate process should be performed in a constant temperature-humidity environment, and an adjusted temperature-humidity gas should be supplied for maintaining the constant environment.

FIG. 1 is a cross-sectional view showing an apparatus for supplying the descending air flow and the temperature-humidity gas. According to FIG. 1, the descending air flow is supplied by a fan filter unit 2, and the temperature-humidity gas is supplied from a plate-shaped discharge member 4. The discharge member 4 is disposed below the fan filter unit 2, and these are faced each other. Therefore, the discharge member 4 locates on a supply path of the descending air flow and prevents a flow of the descending air flow.

Moreover, the discharge member 4 faces the substrate W, and directly supplies the temperature-humidity gas to the substrate W. Accordingly, the liquid supplied to the substrate is directly affected by the temperature-humidity gas.

SUMMARY

Embodiments of the inventive concept provides an apparatus which make a descending air flow smoothly during a liquid-treating of a substrate.

In addition, the embodiment of the inventive concept provides an apparatus preventing that a temperature-humidity gas directly is supplied to an apparatus.

Embodiments of the inventive concept provides an apparatus for treating a substrate. According to one aspect, an apparatus for treating a substrate comprises a housing having a process space therein, a substrate support unit supporting a substrate in the space, a liquid supply unit supplying a liquid to a substrate supported by the substrate support unit, and an air flow generation unit generating an air flow in the process space, and the air flow generation unit comprises a first gas supply unit supplying a descending air flow of a first gas in the process space, and a second gas supply unit supplying a second gas having lower humidity than the first gas in the space, and when viewed from above, the first gas supply unit and the second gas supply unit are not overlapped each other.

The first gas supply unit comprises a ceiling port being installed on a ceiling side of the housing, and facing the substrate support unit, and a first gas supply line connecting with the ceiling port and supplying air to the ceiling port, and when viewed from above, the ceiling port and the substrate support unit are overlapped each other.

The second gas supply unit is provided to discharge the second gas not directly toward the substrate supported by the substrate support unit. A plurality of the second gas supply units are provided, and each of the plurality of the second gas supply units is installed on a side wall of the housing, respectively.

The second gas supply unit comprises a discharge body defining a fluid channel therein and having a discharge port connecting with the fluid channel, the second gas flowing through the fluid channel, and guide member guiding a flow of the second gas for extending a path of second gas in the fluid channel.

A discharge port is formed on a discharge surface of the discharge body, and the discharge body comprises an introduction port in which the second gas is introduced. The guide member comprises an inner member locating in the fluid channel, and surrounding the discharge port when viewed toward the discharge port, and the inner member being coupled to one of the discharge surface and an opposite surface of the discharge surface, and spaced apart from the other of the discharge surface and the opposite surface. The guide member comprises an intermediate member locating in the fluid channel, and surrounding the inner member when viewed toward the discharge port, and comprises an outer member locating in the fluid channel, and surrounding the intermediate member when viewed toward the discharge port, and the intermediate member is coupled to the other of the discharge surface and the opposite surface, and spaced apart from the one of the discharge surface and the opposite surface. And the outer member is coupled to one of the discharge surface and an opposite surface, and spaced apart from the other of the discharge surface and the opposite surface. The discharge port is provided with a slit shape.

The discharge port is formed on a discharge surface of the discharge body, and the discharge body comprises an introduction port in which the second gas is introduced on an opposite surface of the discharge surface. The guide member comprises a first plate locating in the fluid channel, and overlapping with the introduction port when viewed toward the discharge port. And the first plate is coupled to a first side of the discharge body connecting the discharge surface and the opposite surface, and spaced apart from a second side opposing the first side. The guide member further comprises a second plate locating in the fluid channel, and overlapping with the discharge port when viewed toward the discharge port, the second plate is coupled to the second side, and spaced apart from the first side, and the first plate and the second plate are partially overlapped when viewed toward the discharge port. The discharge port is provided with a slit shape.

The second supply unit comprises a discharge body having an introduction port in which the second gas is introduced and a discharge port discharging the second gas, and a first buffer connecting with the introduction port, a second buffer connecting with the discharge port, and a fluid channel connecting the first buffer and the second buffer and flowing the second gas are formed inside the discharge body.

In one exemplary embodiment of the inventive concept, a temperature-humidity adjusting unit is not overlapped with a descending air flow. Thus, a flow of the descending air flow can be smoothly.

In addition, in one exemplary embodiment of the inventive concept, the temperature-humidity adjusting unit does not directly discharge a temperature-humidity gas toward a substrate. Thus, it can minimize that a liquid supplied to the substrate is directly affected by the temperature-humidity gas.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
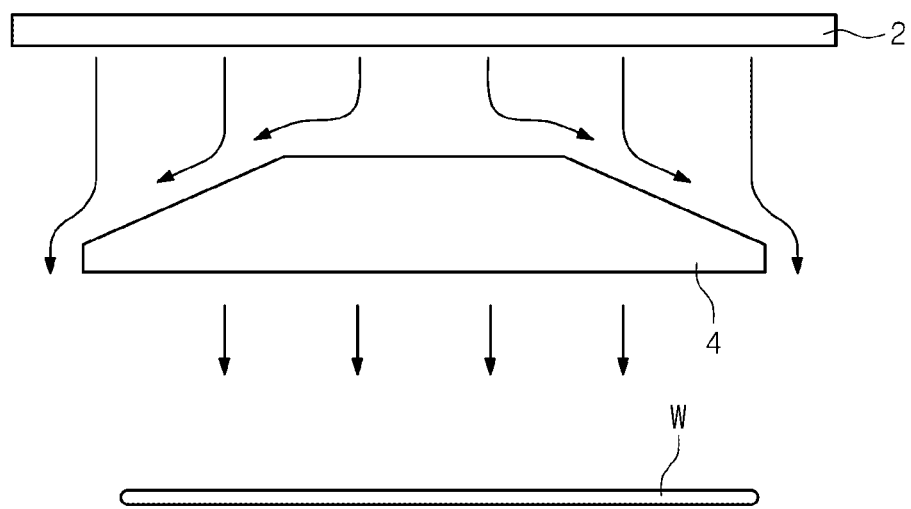
FIG. 1 shows an apparatus supplying a descending air flow and a temperature-humidity gas.

Hereinafter, embodiments of the inventive concept will be described in more detail with reference to the accompanying drawings. The embodiments of the inventive concept may be modified in various forms, and a scope of the inventive concept should not be interpreted as being limited to following embodiments. The embodiments are configured to more fully convey the inventive concept to those of ordinary skill in the art. Therefore, a shape of each of elements in the drawings is exaggerated to emphasize a clearer illustration.

Embodiments of the inventive concept are described with reference to FIG. 2 to FIG. 10.

Figure 2:
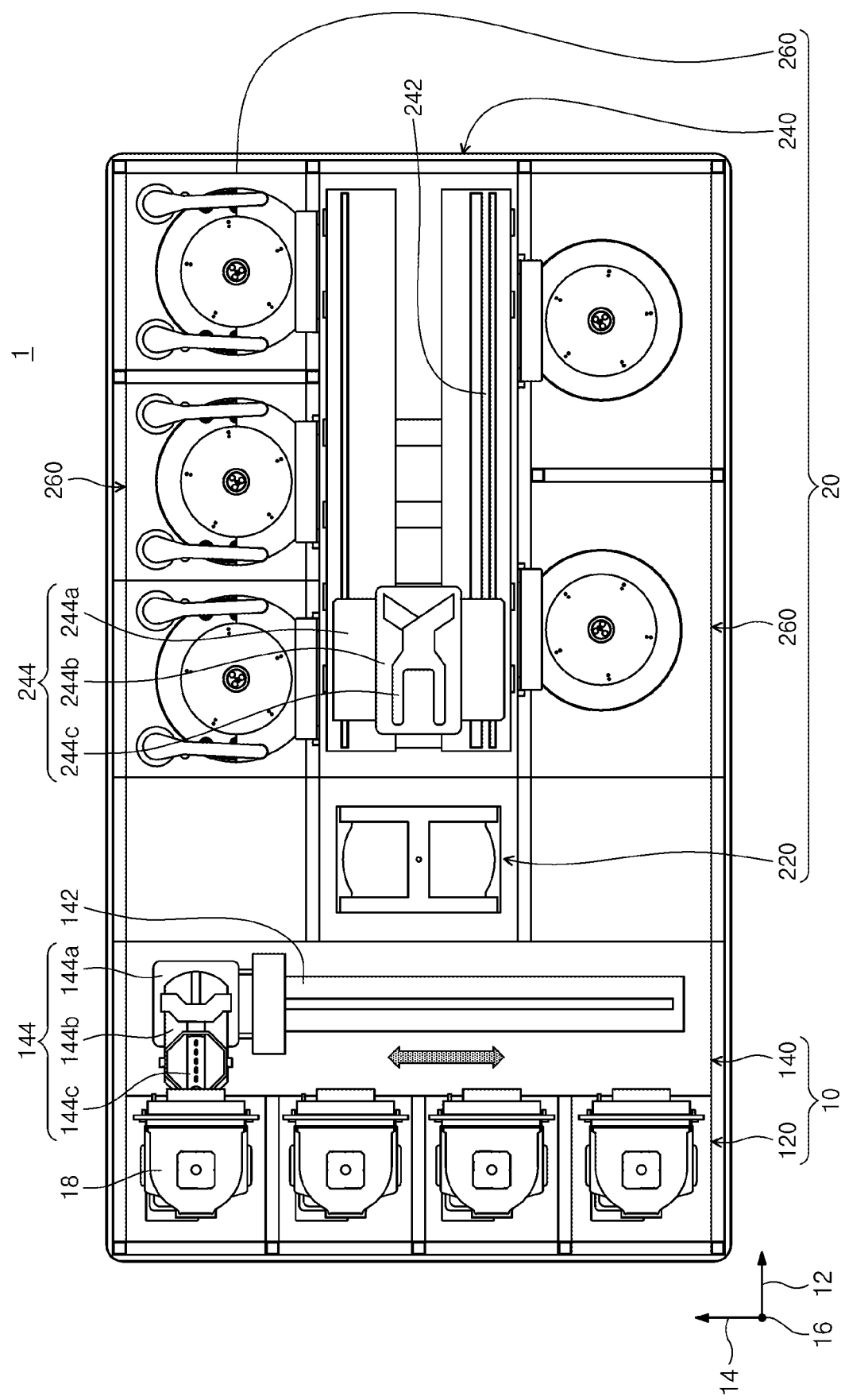
FIG. 2 is a cross-sectional view showing a substrate treating facility according to an exemplary embodiment of the inventive concept.

FIG. 2 is a cross-sectional view showing a substrate treating facility according to an exemplary embodiment of the inventive concept.

Referring to FIG. 2, a substrate treating facility 1 comprises an index module 10 and a process treating module 20, and the index module 10 comprises a load port 120 and a transfer frame 140. The load port 120, the transfer frame 140, and the process treating module 20 are sequentially arranged. Hereinafter, a direction in which the load port 120, the transfer frame 140, and the process treating module 20 are arranged is referred to as a first direction 12, and when viewed from above, a direction perpendicular to the first direction 12 is referred to as a second direction 14, and a direction perpendicular to a plane comprising the first direction 12 and the second direction 14 is referred to as a third direction 16.

A carrier 18 storing a substrate W is mounted on the load port 120. A plurality of load ports 120 are provided and these are arranged along the second direction 14. FIG. 1 describes four load ports 120 are provided. However, the number of the load port 120 may increase or decrease depending on conditions of a process efficiency of the process treating module 20 and a foot print or the like. A slot (not shown) supporting an edge of the substrate is formed in the carrier 18. The slot is provided with a plurality of slots along the third directions 16, and the substrate is placed in the carrier to be separately stacked along the third direction 16. A Front Opening Unified Pod may be used as the carrier 18.

The process treating module 20 comprises a buffer unit 220, a transfer chamber 240, a process chamber 260, an exhaust assembly 500, and a controller 600. The transfer chamber 240 has a longitudinal direction parallel to the first direction 12. The process chambers 260 are arranged at both sides of the transfer chamber 240 along the second direction 14. The process chambers 260 may be provided to be symmetrical each other based on the transfer chamber 240. Some of the process chambers 260 are arranged along a longitudinal direction of the transfer chamber 240. In addition, some of the process chambers 260 are arranged to be stacked each other. That is, the process chambers 260 may be arranged in an array of A×B (A and B is a natural number more than or equal to 1) on both sides of the transfer chamber 240. In this case, A is the number of process chambers 260 provided along the first direction 12, and B is the number of process chambers 260 provided along the third direction 16. In the case that four or six process chambers 260 are provided at both sides of the transfer chamber 240, the process chambers 260 may be arranged in an arrangement of 2×2 or 3×2. The number of process chambers 260 may increase or decrease.

Unlike described above, the process chamber 260 may be provided only one side of the transfer chamber 240. In addition, the process chamber 260 may be provided as a single layer on one side and opposite side of the transfer chamber 240. In addition, unlike described above, the process chamber 260 may be provided in various arrangements. In addition, among the process chambers 260, on one side of the transfer chamber 240, a liquid-treating process of the substrate is performed, and on opposite side, a drying-treating process of the substrate is performed for the substrate for which the liquid-treating process has been performed. The drying-treating process may be a supercritical treating process.

A buffer unit 220 is arranged between the transfer frame 140 and the transfer chamber 240. The buffer unit 220 provides a space in which the substrate W stays before transferring the substrate W between the transfer chamber 240 and the transfer frame 140. The buffer unit 220 comprises a slot (not shown) therein on which the substrate W is placed, and a plurality of slots (not shown) are provided to be separated each other along the third direction 16. In the buffer unit 220, a side facing the transfer frame 140 and a side facing the transfer chamber 240 are opened.

The transfer frame 140 transfers the substrate W between the carrier 18 mounted on the load port 120 and the buffer unit 220. The transfer frame 140 is provided with an index rail 142 and an index robot 144. A longitudinal direction of the index rail 142 is provided parallel to the second direction 14. The index robot 144 is installed on the index rail 142, and linearly travels along the index rail 142 along the second direction 14. The index robot 144 comprises a base 144a, a body 144b, and an index arm 144c. The base 144a is installed movably on the index rail 142. The body 144b is movably coupled to the base 144a, along the third direction. In addition, the body 144b is rotably provided on base 144a. The index arm 144c is coupled to the body 144b, and is capable of traveling toward and backward the body 144b. The index arm 144c is provided in a plurality of arms individually driven. The index arms 144c are arranged to be spaced apart and stacked each other along the third direction 16. Some of the index arms 144c may be used when transferring the substrate W from the process treating module 20 to the carrier 18, and some of the index arms 144c may be used when transferring the substrate W from the carrier 18 to the process treating module 20. In the process that the index robot 144 introduces and withdraws the substrate W, particles which are generated from the substrate W before the process treating can be prevented from being attached to the substrate W after the process treating.

The transfer chamber 240 transfers the substrate W between the buffer unit 220 and the process chambers 260. A guide rail 242 and a main robot 244 are provided in the transfer chamber 240. The longitudinal direction of the guide rail 242 is arranged parallel to the first direction 12. The main robot 244 is installed on the guide rail 242, and is linearly traveled along the first direction 12 on the guide rail 242.

Hereinafter, a substrate treating apparatus 300 provided in the process chamber 260 will be described. In one exemplary embodiment of the inventive concept, the substrate treating apparatus 300 performs a liquid-treating process on the substrate. The liquid-treating process may comprise a process of cleaning the substrate or removing a film formed on the substrate.

Figure 3:
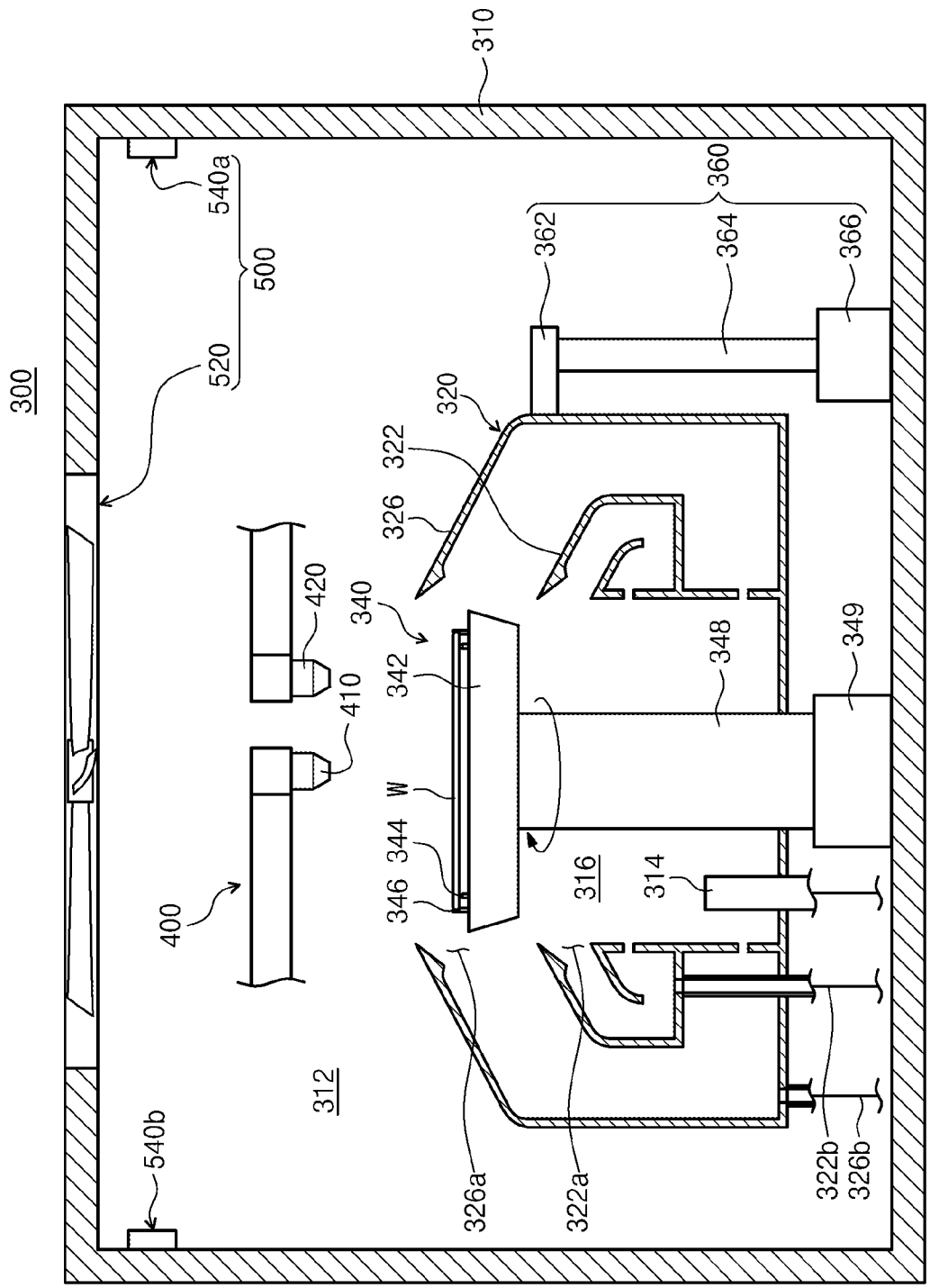
FIG. 3 is a plan view showing a substrate treating apparatus of FIG. 2

FIG. 3 is a plan view showing a substrate treating apparatus of FIG. 2 Referring to FIG. 3, the substrate treating apparatus 300 comprises a housing 310, a treating container 320, a spin head 340, a lifting unit 360, a liquid supply unit 400, and an air flow forming unit 500. The housing 310 provides a process space 312 therein where a process of treating the substrate W. An exhaust pipe 314 is installed in a bottom of the housing 310. The exhaust pipe 314 is provided as a pipe exhausting the process space 312. The exhaust pipe 314 may be provided with a decompression member 540.

A treating container 320 is located in the process space 312, and a top portion of the treating container 320 is opened and the container 320 is provided as a cup shape. The inner space of the treating container 320 is provided as a treating space for treating the substrate W. When viewed from above, the treating container 320 overlaps with the exhaust pipe 314. The treating container 320 comprises an inner collecting container 322 and an outer collecting container 326. Each of the collecting container 322, 326 collects different treating liquid used in the process. The inner collecting container 322 is provided in an annular ring shape surrounding the spin head 340, and the outer collecting container 326 is provided as an annular ring shape surrounding the inner collecting container 322. An inner space 322a of inner collecting container 322 and an interspace 326a between the outer collecting container 326 and the inner collecting container 322 functions as inlets through which treating liquids flow into the inner collecting container 322 and outer collecting container 326, respectively. Each of the collecting containers 322, 326 connects respective collecting lines 322b, 326b extending vertically below a bottom. Each of the collecting lines 322b, 326b functions as a discharge pipe discharging treating liquid flowed into through the respective collecting container 322, 326. The discharged treating liquid may be reused through an outer treating liquid regeneration system (not shown).

The spin head 340 is provided as a substrate support unit 340 supporting and rotating the substrate W. The spin head 340 is arranged within the treating container 320. The spin head 340 supports and rotates the substrate W during the process. The spin head 340 has a body 342, a support pin 344, a chuck pin 346, and a support shaft 348. The body 342 comprises an upper surface which is provide as a circular shape generally when viewed from above. A bottom surface of the body 342 is fixedly coupled to the support shaft 348 which can be rotated by a motor 349. A plurality of support pins is provided. The support pins 344 are arranged along the edge of the upper surface of the body 342 with being spaced apart from each other and are protruded upward from the body 342. The support pins 344 are arranged as an annular ring shape. The support pins 344 support edge of the rear surface of the substrate W so that the substrate W is spaced apart from the upper surface of the body 342 with a constant distance. A plurality of chuck pins 346 are provided. The chuck pin 346 is arranged farther from the center of the body 342 than the support pins 344. The chuck pins 346 are protruded upward from the body 342. The chuck pins 346 support or hole a lateral side of the substrate W so that the substrate W deviates laterally from a normal position when the spin head 340 rotates. The chuck pins 346 are provided linearly movable between a standby position and a support position along a radial direction of the body 342. The standby position is away farther from the center of the body 342 than the support position. When the substrate W is loaded to or unloaded from the spin head 340, the chuck pins 346 are located on the standby position, and the chuck pin 346 are located on the support position to support or hold the substrate W for processing the substrate W. At the support position, the chuck pins 346 contact with the lateral side of the substrate W.

A lifting unit 360 adjusts the relative height between the treating container 320 and the spin head 340. The lifting unit 360 linearly and vertically moves the treating container 320. As the treating container 320 travels vertically, the relative height of the treating container 320 to the spin head 340 changes. The lifting unit 360 comprises a bracket 362, a moving shaft 364, and a driver 366. The bracket 362 is fixedly installed to the outer wall of the treating container 320, and the moving shaft 364 which can travel vertically by the driver 366 is fixedly coupled to the bracket 362. When the substrate W is placed on the spin head 340 or lifted from the spin head 340, the treating container 320 is descended, so that the spin head 340 protrudes above the treating container 320. In addition, when the process is performed, according to a type of the treating liquid supplied to the substrate W, a height of the treating container 320 is adjusted such that the treating liquid can flow into proper one of the collecting container 360.

Unlike described above, the lifting unit 360 can move the spin head 340 vertically instead of the treating container 320.

The liquid supply unit 400 supplies various types of treating liquid on the substrate W. The liquid supply unit 400 supplies a treating liquid cleaning the substrate W or removing a film of the substrate W. The liquid supply unit 400 comprises a first nozzle 410 and a second nozzle 420. The first nozzle 410 supplies a first liquid, and the second nozzle 420 supplies a second liquid. Each nozzle 410, 420 is traveled to a process position and a standby position. In this point, the process position refers to a position where each nozzle 410, 420 can discharge the treating liquid on the substrate W located in the treating container 320, and the standby position refers to a position where each nozzle 410, 420 is out of the process position and stands by. According to an example, the process position may be a position in which the nozzles 410, 420 can supply liquid to the center of the substrate W. For example, when viewed from above, the nozzles 410, 420 may be traveled linearly or rotated axially, so it can be traveled between the process position and the standby position.

The first liquid comprises a chemical and the second liquid may comprise an organic solvent. The chemical and the organic solvent may be different types of liquid. The chemical may be a liquid comprising an inorganic material, and the organic solvent may be a liquid comprising an organic material. The chemical may be a liquid comprising sulfuric acid or ammonia. The organic solvent may be isopropyl alcohol (IPA).

An air flow forming unit 500 forms an air flow in the process space 312. The air flow forming unit 500 forms a generally downward direction air flow in the process space 312. The air flow forming unit 500 comprises a descending air flow unit 520 and a temperature-humidity adjusting unit 540. For example, the descending air flow unit 520 may be provided with a first gas supply unit 520 supplying a first gas, and the temperature-humidity adjusting unit 540 may be provided with a second gas supply unit 540 supplying a second gas. The descending air flow unit 520 supplies a first gas flowing downwardly in the process space 312, and the temperature-humidity adjusting unit 540 supplies a temperature-humidity adjusted second gas to the process space 312. The second gas is provided as a gas having a lower humidity than the first gas. The second gas may be clean dry air (CDA). When viewed from above, the descending air flow unit 520 and the temperature-humidity adjusting unit 540 are not overlapped. The first gas of the descending air flow unit 520 is directly supplied to the substrate W, while the second gas is not directly supplied to the substrate W.

The descending air flow unit 520 comprises a fan filter 526 installed on a ceiling side of the housing 310. The descending air flow unit 520 comprises a ceiling port 522, a gas supply line 524, and a filter 526. The ceiling port 522 is installed on the ceiling side of the housing 310. The ceiling port 522 is faced vertically with the substrate W located within the treating space 316. A fan may be installed in the ceiling port 522. Accordingly, the descending air flow of the first gas supplied from the fan may be flowed into the treating space 316. The air supply line supplies air to the fan, and the filter 526 filters the supplied air. For example, the air supplied from the ceiling port 522 may be a clean air.

The temperature-humidity adjusting unit 540 supplies the second gas to the process space 312. The second gas comprises a temperature-humidity adjusted gas. In addition, the second gas may comprise a gas which is only humidity adjusted except for the temperature. One or a plurality of temperature-humidity adjusting units 540 can be provided. In one exemplary embodiment of the inventive concept the temperature-humidity adjusting unit 540 is provided in two. However, the number of the temperature-humidity adjusting unit 540 of the exemplary embodiment is not limited thereto, and may be provided in one or three or more.

Figure 4:
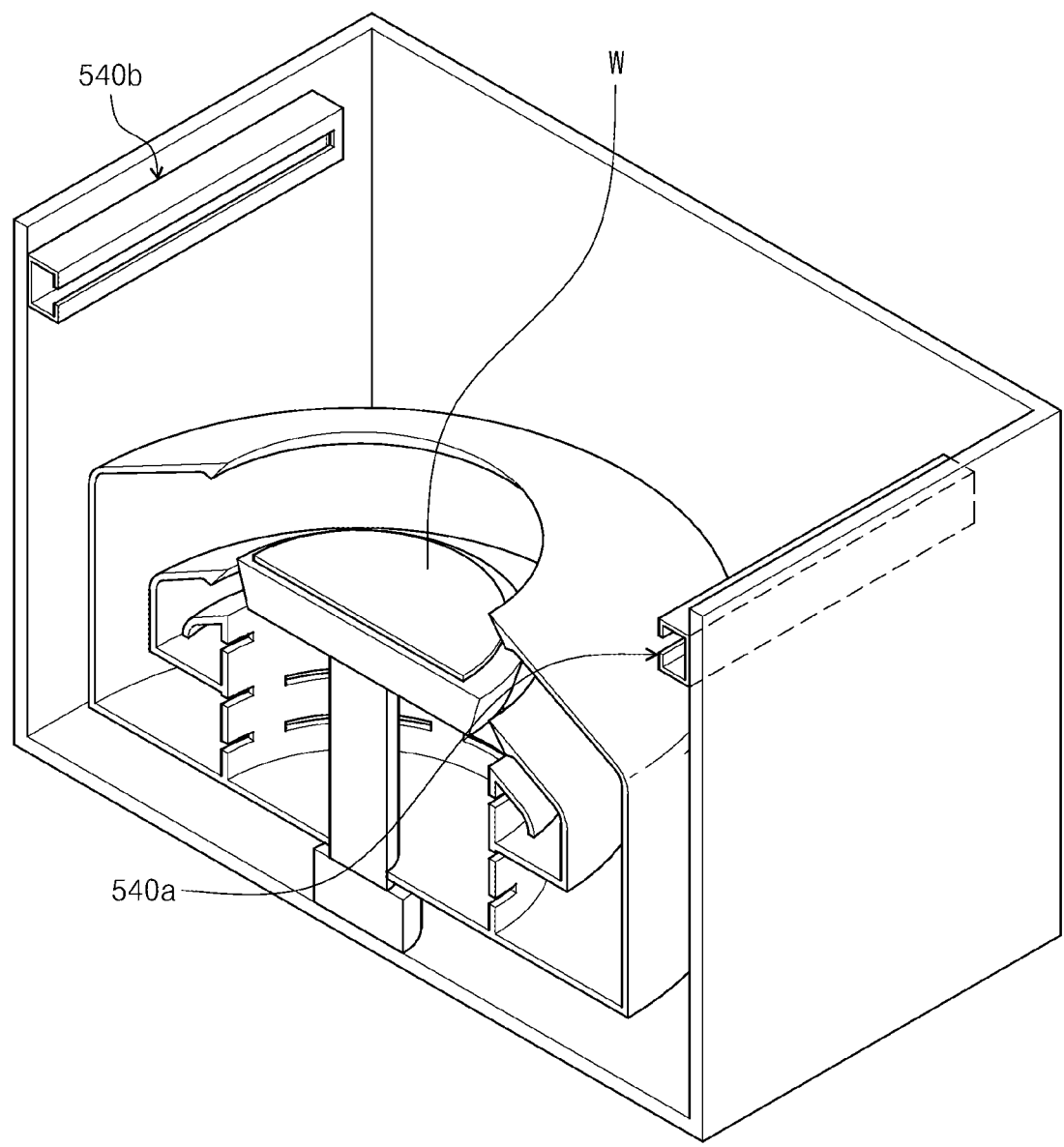
FIG. 4 is a cut-out perspective view partially showing a substrate treating apparatus of FIG. 3
Figure 5:
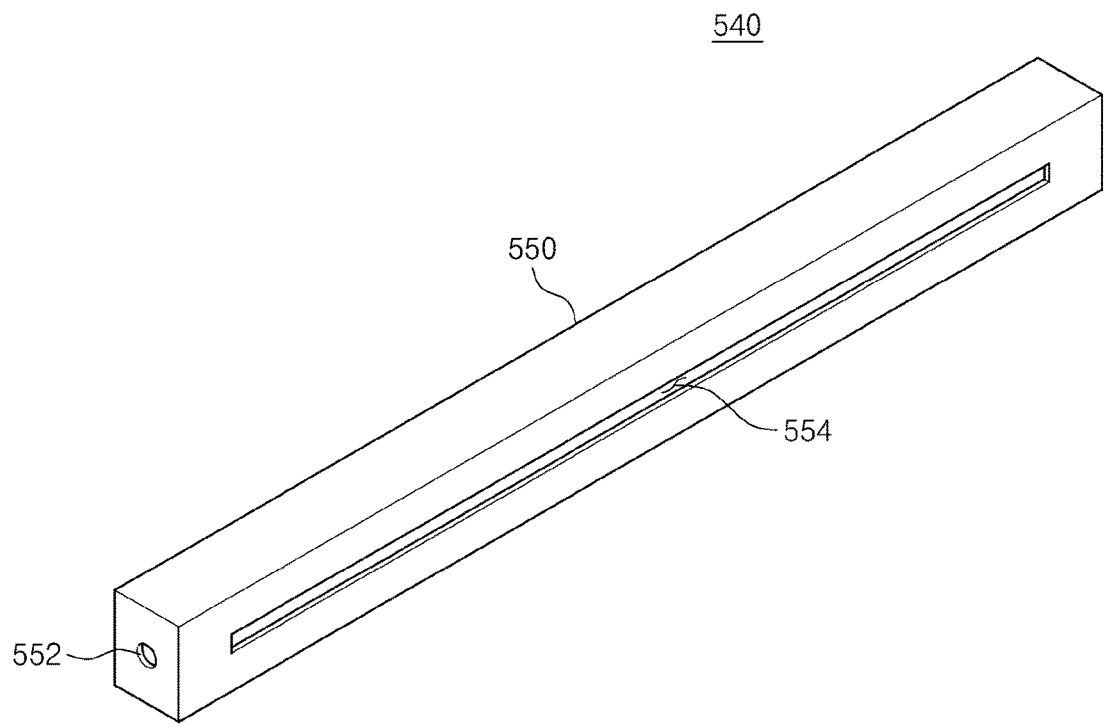
FIG. 5 is a perspective view showing a temperature-humidity adjusting unit of FIG. 3

FIG. 4 is a cut-out perspective view partially showing a substrate treating apparatus of FIG. 3, FIG. 5 is a plan view showing the temperature-humidity adjusting plate in FIG. 5. Referring to FIGS. 4 and 5, the temperature-humidity adjusting units 540a, 540b are installed on each of sidewalls of the housing 310 respectively. When viewed from above, the temperature-humidity adjusting unit 540 may be located to face each other with the substrate W therebetween. According to one example, the temperature-humidity adjusting unit 540 may be located higher than the treating container 320. The temperature-humidity adjusting unit 540 can supply a second gas on a path to which the first gas is supplied in an upper space of the treating container 320. It is for allowing the second gas to be mixed with a descending air flow of the first gas so that the second gas smoothly flows into the treating space 316.

Optionally, the second gas may be supplied to the outer side of the treating container 320. However, in this case, the second gas may cause a vortex or retention, so it is advisable that the second gas is supplied on the path of the descending air flow of the first gas.

Figure 6:
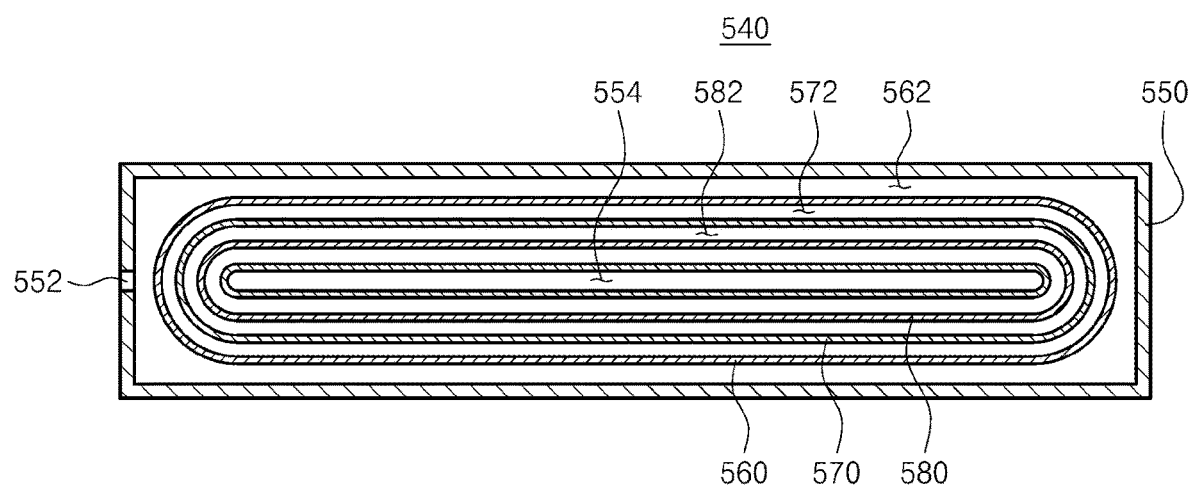
FIG. 6 shows a first example of a temperature-humidity adjusting unit of FIG. 5.
Figure 7:
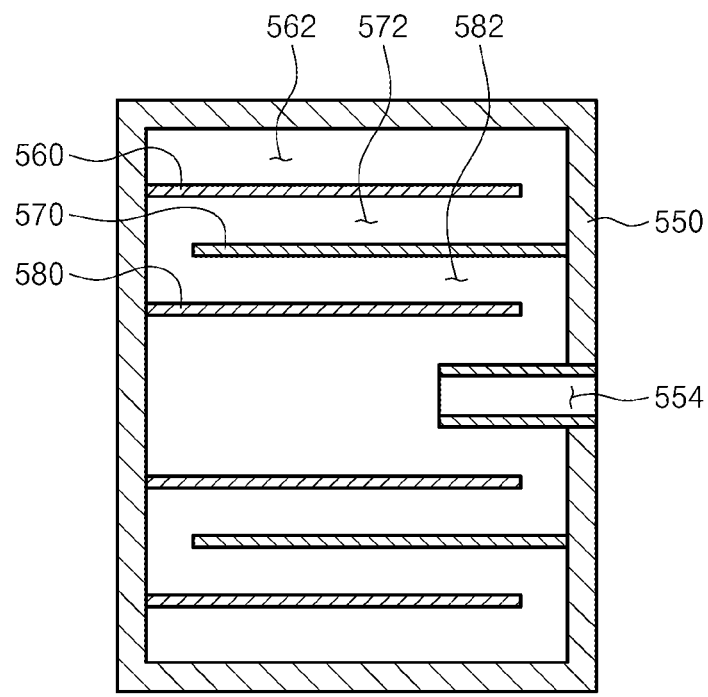
FIG. 7 shows a temperature-humidity adjusting unit of FIG. 3 viewed from another direction.

Hereinafter, the temperature-humidity adjusting unit 540 will be described in more detail. FIG. 6 shows a first example of the temperature-humidity adjusting unit of FIG. 5, FIG. 7 shows a temperature-humidity adjusting unit of FIG. 6 viewed from another direction. Referring to FIG. 6 and FIG. 7, the temperature-humidity adjusting unit 540 comprises a discharge body 550 and guide members 560, 570, 580. The discharge body 550 may have a cylindrical shape elongated in one direction. A slit-shaped discharge port 554 may be formed on an outer side of the discharge body 550. The discharge port 554 may be provided parallel to a longitudinal direction of the discharge body 550. The discharge port 554 is formed on a discharge surface of the discharge body 550. The discharge surface may be a side or a downward inclined side. That is, the discharge port 554 may be provided to face a horizontal direction or a downward inclined direction. A fluid channel space for the second gas flow is formed in the discharge body 550, and an introduction port 552 through which the second gas is introduced into the fluid channel space is formed on one side of the discharge body 550. The introduction port 552 is communicated with the fluid channel space.

The guide members 560, 570, 580 are disposed in the fluid channel to guide a flow of the second gas in the fluid channel space, so that a flow path of the second gas is lengthened in the fluid channel space. According to one example, the guide members 560, 570, 580 comprises an outer member 560, an intermediate member 570, and an inner member 580. The outer member 560 and the intermediate member 570, and the intermediate member 570 and the inner member 580 can be provided to have different heights respectively. When viewed toward the discharge port 554, the outer member 560 is a ring shape surrounding the discharge port 554, and is spaced apart from the inner surface of the discharge body 550. The outer member 560 is coupled to one of a discharge surface and an opposite surface of the discharge body 550, and is spaced apart from (e.g., not coupled to) the other of the discharge surface and the opposite surface of the discharge body 550. For example, the outer member 560 may be coupled to the opposite surface of the discharge body 500, not to the discharge surface of the discharge body 500. A height of the outer member 560 at least corresponds to a height of the introduction port 552. In an exemplary embodiment of the inventive concept, the space that is defined by an inner surface of the discharge body 550 and the outer member 560 in the fluid channel space may be referred to as an outer space 562. The outer space 562 is communicated with the introduction port 552. Accordingly, the second gas introduced through the introduction port 552 is diffused at the outer space 562. The second gas is firstly diffused in the outer space 562 and then traveled in the inward direction through a separate space between the outer member 560 and another.

When viewed toward the discharge port 554, the intermediate member 570 is a ring shape surrounding the discharge port 554, and is located in inner side of the outer member 560. The intermediate member 570 is spaced apart from the outer member 560. The intermediate member 570 is coupled to one of the discharge surface and the opposite surface of the discharge body 550 and is spaced apart from (e.g., not coupled to) the other of the discharge surface and the opposite surface of the discharge body. For example, the intermediate member 570 may be coupled to the discharge surface of the discharge body 500, not to the opposite surface of the discharge body 500. That is, when the intermediate member 570 is coupled to the discharge surface of the discharge body 500, the outer member 560 is coupled to the opposite surface of the discharge body 500, or vice versa. Accordingly, the flow path of the second gas provided in the fluid channel space can be lengthened. When viewed toward the discharge port 554, a space between the intermediate member 570 and the outer member 560 in the fluid channel space may be referred to as an intermediate space 572. Thus, a firstly diffused second gas in the outer space 562 is traveled to the intermediate space 572 where the second gas is secondarily diffused, and then the second gas travels inward through a separate space between the intermediate member 570 and another.

When viewed toward the discharge port 554, the inner member 580 is a ring shape surrounding the discharge port 554, and is located in inner side of the intermediate member 570. The inner member 580 is spaced apart from the intermediate member 570. The inner member 580 is coupled to one of the discharge surface and the opposite surface of the discharge body 550 and is not coupled to the other of the discharge surface and the opposite surface of the discharge body 550. For example, the inner member 580 may be coupled to the opposite surface of the discharge body 500, not to the discharge surface of the discharge body 500. That is, when the inner member 580 is coupled to the opposite surface of the discharge body 500, the intermediate member 570 is coupled to the discharge surface of the discharge body 500, or vice versa. Accordingly, the flow path of the second gas provided in the fluid channel space can be lengthened. When viewed toward the discharge port 554, a space between the intermediate member 570 and the inner member 580 in the fluid channel space may be referred to as an inner space 582. Thus, the secondarily diffused gas in the intermediate space 572 is traveled to the inner space 582 where the second gas is thirdly diffused, and then the second gas is discharged through the discharge port 554.

Figure 8:
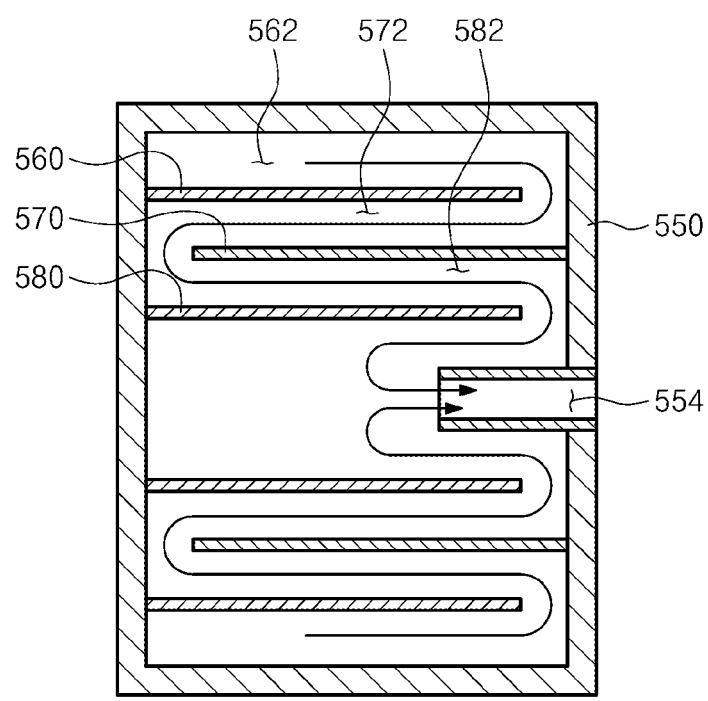
FIG. 8 shows a path that a temperature-humidity gas is supplied in a fluid channel space of FIG. 6.
Figure 9:
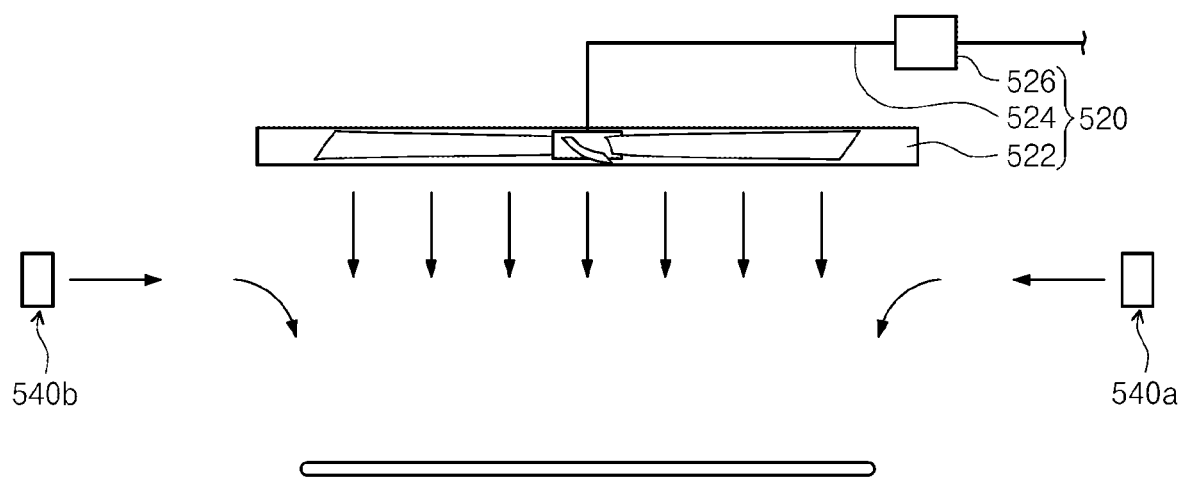
FIG. 9 shows flow of gas which is formed in a process space of FIG. 3

As described above, the outer space 562, the intermediate space 572, and the inner space 582 have a ring shape respectively. Accordingly, the second gas is diffused through a ring shaped spaces sequentially, and thus once one ring-shaped space is filled with a certain level of the diffused second gas, and then the diffused second gas travels to a next ring-shaped space for further diffusion. That is, the outer space 562, the intermediate space 572, and the inner space 582 function as a buffer space in which the second gas can be sufficiently diffused. Accordingly, as shown in FIG. 8, the second gas can be uniformly supplied to the slit-shaped discharge port 554, and as shown in FIG. 9, the temperature and humidity of the process space 312 can be adjusted without directly supplying the second gas to the substrate W.

Figure 10:
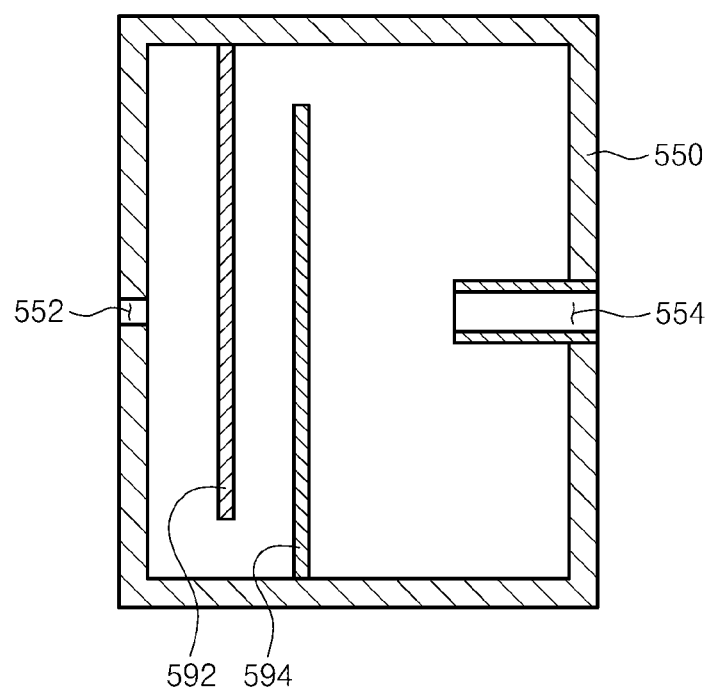
FIG. 10 shows a second example of a temperature-humidity adjusting unit of FIG. 3.

According to the above described example, the guide members 560, 570, 580 of the temperature-humidity adjusting unit 540 are described as being provided with a plurality of ring-shaped members. However, as shown in FIG. 10, the guide member may comprise a plurality of plates 592, 594. The guide members 560, 570, 580 may comprise a first plate 592 and a second plate 594. The introduction port 552 is provided on one of first side surface and second side surface facing each other and connecting the discharge surface the opposing surface. For example, the introduction part 552 may be provided on the first side surface of the discharging body 550. The first plate 592 and the second plate 592 can be arranged spaced apart from the first side surface and the second side surface in the fluid channel space. For example, the first plate 592 may be coupled to the first side surface and not be coupled to the second side surface. The second plate 594 may be coupled to the second side surface and not be coupled to the first side surface. When viewed from the opposite surface to the discharge surface, the first plate 592 and the second plate 594 may be partially overlapped.

The effects of the inventive concept are not limited to the above-described effects, and effects not mentioned may be clearly understood by those of ordinary skill in the art from the present specification and the accompanying drawings.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for treating a substrate, the apparatus comprising:
    a housing having a process space therein;
    a substrate support unit supporting a substrate in the process space;
    a liquid supply unit supplying a liquid to a substrate supported by the substrate support unit; and
    an air flow generation unit generating an air flow in the process space,
    wherein the air flow generation unit comprises:
        a first gas supply unit supplying a descending air flow of a first gas in the process space;
        a second gas supply unit supplying a second gas having lower humidity than the first gas in the process space,
    wherein, when viewed from above of the housing, the first gas supply unit and the second gas supply unit are not overlapped with each other, and
    wherein the second gas supply unit comprises a first introduction port and a second introduction port disposed on opposing sidewalls of the housing and on opposing sides of the first gas supply unit, the first introduction port facing the second introduction port such that the first introduction port and the second introduction port introduce the second gas toward each other in the housing.

2. The apparatus of claim 1, wherein the first gas supply unit comprises:
    a ceiling port being installed on a ceiling side of the housing, and facing the substrate support unit; and
    a first gas supply line connecting with the ceiling port and supplying air to the ceiling port, and
    wherein, when viewed from the above of the housing, the ceiling port and the substrate support unit are overlapped with each other.

3. The apparatus of claim 2, wherein the second gas supply unit is provided to discharge the second gas not directly toward the substrate supported by the substrate support unit.

4. The apparatus claim 1, wherein the second gas supply unit comprises:
   a discharge body defining a fluid channel therein and having a discharge port connecting with the fluid channel, the second gas flowing through the fluid channel; and
   a guide member guiding a flow of the second gas for extending a path of second gas in the fluid channel.

5. The apparatus of claim 4, wherein the discharge port is formed on a discharge surface of the discharge body, and the discharge body comprises the first introduction port in which the second gas is introduced.

6. The apparatus of claim 5, wherein the guide member comprises:
   an inner member locating in the fluid channel, and surrounding the discharge port when viewed toward the discharge port, the inner member being coupled to one of the discharge surface and an opposite surface of the discharge surface, and spaced apart from an other of the discharge surface and the opposite surface.

7. The apparatus of claim 6, wherein the guide member further comprises:
   an intermediate member locating in the fluid channel, and surrounding the inner member when viewed toward the discharge port; and
   an outer member locating in the fluid channel, and surrounding the intermediate member when viewed toward the discharge port,
   wherein the intermediate member is coupled to the other of the discharge surface and the opposite surface, and spaced apart from the one of the discharge surface and the opposite surface, and
   wherein the outer member is coupled to one of the discharge surface and the opposite surface, and is spaced apart from the other of the discharge surface and the opposite surface.

8. The apparatus of claim 7, wherein the discharge port has a slit shape.

9. The apparatus of claim 4, wherein the discharge port is formed on a discharge surface of the discharge body, and the discharge body comprises the first introduction port in which the second gas is introduced on an opposite surface of the discharge surface.

10. The apparatus of claim 9, wherein the guide member comprises:
    a first plate locating in the fluid channel, and overlapping with the first introduction port when viewed toward the discharge port, and
    wherein the first plate is coupled to a first side of the discharge body connecting the discharge surface and the opposite surface, and is spaced apart from a second side opposing the first.

11. The apparatus of claim 10, wherein the guide member further comprises:
    a second plate locating in the fluid channel, and overlapping with the discharge port when viewed toward the discharge port,
    wherein the second plate is coupled to the second side, and is spaced apart from the first side,
    wherein the first plate and the second plate are partially overlapped with each other when viewed toward the discharge port.

12. The apparatus of claim 11, wherein the discharge port has a slit shape.

13. The apparatus of claim 1, wherein the second gas supply unit comprises:
    a discharge body having the first introduction port in which the second gas is introduced and a discharge port discharging the second gas, and
    wherein a first buffer connecting with the first introduction port, a second buffer connecting with the discharge port, and a fluid channel connecting the first buffer and the second buffer and flowing the second gas are formed inside the discharge body.

14. An apparatus for treating a substrate, the apparatus comprising:
    a housing having a process space therein;
    a substrate support unit supporting a substrate in the process space;
    a liquid supply unit supplying a liquid to the substrate supported by the substrate support unit;
    an air flow generation unit generating an air flow in the process space,
    wherein the air flow generation unit comprises:
       a first gas supply unit supplying a first gas to the substrate; and
       a second gas supply unit supplying a second gas having lower humidity than the first gas to the substrate,
    wherein an air flow direction of the first gas is different from an air flow direction of the second gas, and
    wherein the second gas supply unit comprises a first introduction port and a second introduction port disposed on opposing sidewalls of the housing and on opposing sides of the first gas supply unit, the first introduction port facing the second introduction port such that the first introduction port and the second introduction port introduce the second gas toward each other in the housing.

15. The apparatus of claim 14, wherein, when viewed from above of the housing, the first gas supply unit and the second gas supply unit are not overlapped with each other.

16. The apparatus of claim 14, wherein the first gas supply unit comprises:
    a ceiling port installed at a ceiling side of the housing, and facing the substrate support unit; and
    a first gas supply line which is connected with the ceiling port and supplies air to the ceiling port, and
    wherein, when viewed from above the housing, the ceiling port and the substrate support unit are overlapped with each other.

17. The apparatus of claim 14, wherein the second gas supply unit is provided not to discharge the second gas directly toward the substrate supported by the substrate support unit.

18. The apparatus of claim 14, wherein the second gas supply unit comprises:
    a discharge body defining a fluid channel flowing the second gas inside, and having a discharge port connecting with the fluid channel; and
    a guide member guiding a flow of the fluid channel for extending a path of the fluid channel.

19. An apparatus for treating a substrate, the apparatus comprising:
    a housing having a process space therein;
    a substrate support unit supporting a substrate in the process space;
    a liquid supply unit supplying a liquid to a substrate supported by the substrate support unit;

an air flow generation unit generating an air flow in the process space, wherein the air flow generation unit comprises:
   a first gas supply unit supplying a descending air flow of a first gas in the process space; and
   a second gas supply unit supplying a second gas having lower humidity than the first gas in the process space, wherein the first gas is supplied directly to the substrate, wherein the second gas is supplied indirectly to the substrate, and wherein the second gas supply unit comprises a first introduction port and a second introduction port disposed on opposing sidewalls of the housing and on opposing sides of the first gas supply unit, the first introduction port facing the second introduction port such that the first introduction port and the second introduction port introduce the second gas toward each other in the housing.

\* \* \* \* \*